US009892765B2

(12) United States Patent
Curatolo et al.

(10) Patent No.: US 9,892,765 B2
(45) Date of Patent: Feb. 13, 2018

(54) CIRCUIT FOR INJECTING COMPENSATING CHARGE IN A BIAS LINE

(71) Applicant: Infineon Technologies AG, Neubiberg (DE)

(72) Inventors: Giacomo Curatolo, Unterhaching (DE); Leonardo Castro, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/095,189

(22) Filed: Apr. 11, 2016

(65) Prior Publication Data

US 2016/0300598 A1    Oct. 13, 2016

(30) Foreign Application Priority Data

Apr. 13, 2015  (DE) .................. 10 2015 105 565

(51) Int. Cl.
| | |
|---|---|
| *G11C 7/06* | (2006.01) |
| *G05F 3/26* | (2006.01) |
| *G11C 7/02* | (2006.01) |

(52) U.S. Cl.
CPC .............. *G11C 7/062* (2013.01); *G05F 3/262* (2013.01); *G11C 7/02* (2013.01); *G11C 7/067* (2013.01); *G11C 2207/063* (2013.01)

(58) Field of Classification Search
None
See application file for complete search history.

(56) References Cited

U.S. PATENT DOCUMENTS

| | | | |
|---|---|---|---|
| 6,333,670 B1 | 12/2001 | Kono et al. | |
| 6,426,671 B1 | 7/2002 | Kono | |
| 6,696,881 B1* | 2/2004 | Ho | G05F 3/262 323/315 |
| 7,030,682 B2* | 4/2006 | Tobita | H02M 3/073 327/536 |
| 2002/0024380 A1 | 2/2002 | Kono | |
| 2007/0247885 A1* | 10/2007 | Watanabe | G11C 15/04 365/49.17 |
| 2007/0273434 A1* | 11/2007 | Chang | G05F 3/262 327/543 |

FOREIGN PATENT DOCUMENTS

| | | |
|---|---|---|
| DE | 10022665 A1 | 2/2001 |
| DE | 10106407 A1 | 2/2002 |

* cited by examiner

*Primary Examiner* — J. H. Hur
(74) *Attorney, Agent, or Firm* — Viering,Jentschura&Partner mbB

(57) ABSTRACT

According to one embodiment, a circuit is described including a circuit component configured to switch from a first state into a second state including a node whose potential changes by a predetermined voltage when the circuit component switches from the first state into the second state, a line coupled with the node wherein the switching of the circuit component from the first state into the second state draws or injects a predetermined charge from or into the line, a capacitor coupled to the line and a compensation circuit configured to generate a predetermined multiple of the predetermined voltage and to compensate the charge drawn from or injected into the line by driving the capacitor with the multiple of the predetermined voltage.

21 Claims, 7 Drawing Sheets

--Prior Art--

FIG 2 —Prior Art—

CIRCUIT FOR INJECTING COMPENSATING CHARGE IN A BIAS LINE

CROSS-REFERENCE TO RELATED APPLICATION

This application claims priority to German Patent Application Serial No. 10 2015 105 565.1, which was filed Apr. 13, 2015, and is incorporated herein by reference in its entirety.

TECHNICAL FIELD

The present disclosure relates to circuits, e.g. memory sense amplifier circuits.

BACKGROUND

Sense amplifiers are used as sensing elements to detect the cell status in a memory array field. There is an increasing demand for performance improvements such as latency reduction and power reduction. Dynamic accuracy has become the most limiting factor for sensing accuracy. For example, when starting a read operation from an idle mode a sense amplifier has to rapidly move from a power safe mode to a high performance mode and the latency and the errors that this transition implies affects the overall sense amplifier performance. Accordingly, sense amplifier circuits and similarly circuits for other applications are desirable which allow a fast switching from a power safe mode to an operational mode.

SUMMARY

According to one embodiment, a circuit is provided including a circuit component configured to switch from a first state into a second state including a node whose potential changes by a predetermined voltage when the circuit component switches from the first state into the second state, and a line coupled with the node. The switching of the circuit component from the first state into the second state draws or injects a predetermined charge from or into the line. The circuit may further include a capacitor coupled to the line and a compensation circuit configured to generate a predetermined multiple of the predetermined voltage and to compensate the charge drawn from or injected into the line by driving the capacitor with the multiple of the predetermined voltage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
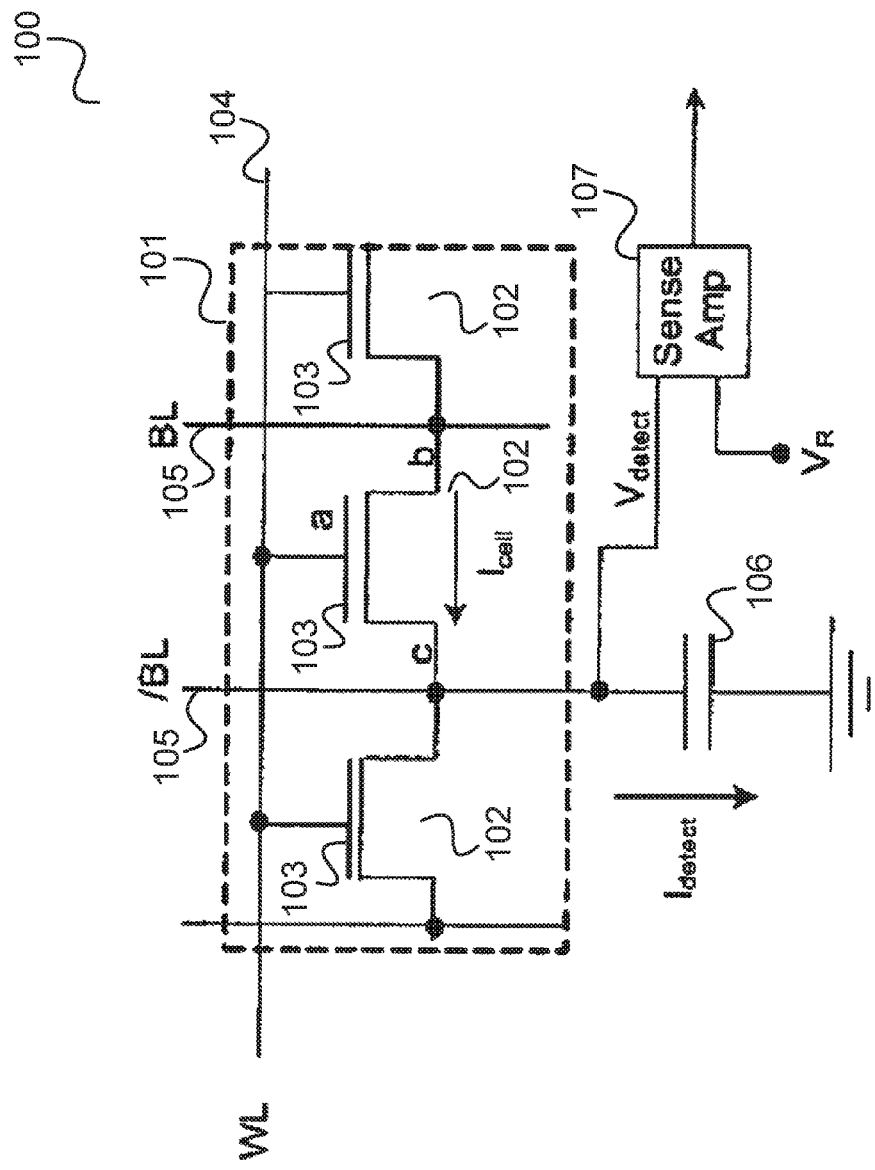
FIG. 1 shows a memory arrangement.

FIG. 1 shows a memory arrangement 100.

The memory arrangement 100 shows a memory array 101 including memory cells 102. Each memory cell 102 has a gate 103 connected to a word line 104 and a source and a drain and is connected with its source and drain between two complementary bit lines 105.

For example, the middle memory cell 102 is connected to the right to a bit line BL and to the left to a bit line /BL. For reading out this memory cell 102, the bit line /BL is connected to a capacitor 106 (connected to ground with its other terminal) and to a first input of a sense amplifier 107. Depending on the state of the middle memory cell 102, i.e. depending on whether it stores a logical 0 or a logical 1, the current through the cell $I_{cell}$ has a higher value or a lower value and the capacitor 106 is loaded to a higher voltage or a lower voltage (in a certain time). The sense amplifier 107 detects the size of this voltage, e.g. by comparing it with a reference voltage $V_R$ input at a second input to the sense amplifier 107 and outputs the result of the detection.

The sense amplifier 107 may for example be implemented using a current mirror to compare the memory cell current with a reference current or to process the memory cell current (such as conversion of current to voltage, integration of the current etc.).

Since the sense amplifier area is typically constrained by the number of sense amplifiers to be placed on silicon, only basic structures can usually be implemented locally in the sense amplifiers and all the more complicated structures are provided in a central biasing or control Block that for example generates most of the analog voltages/currents to serve multiple sense amplifiers.

Figure 2:
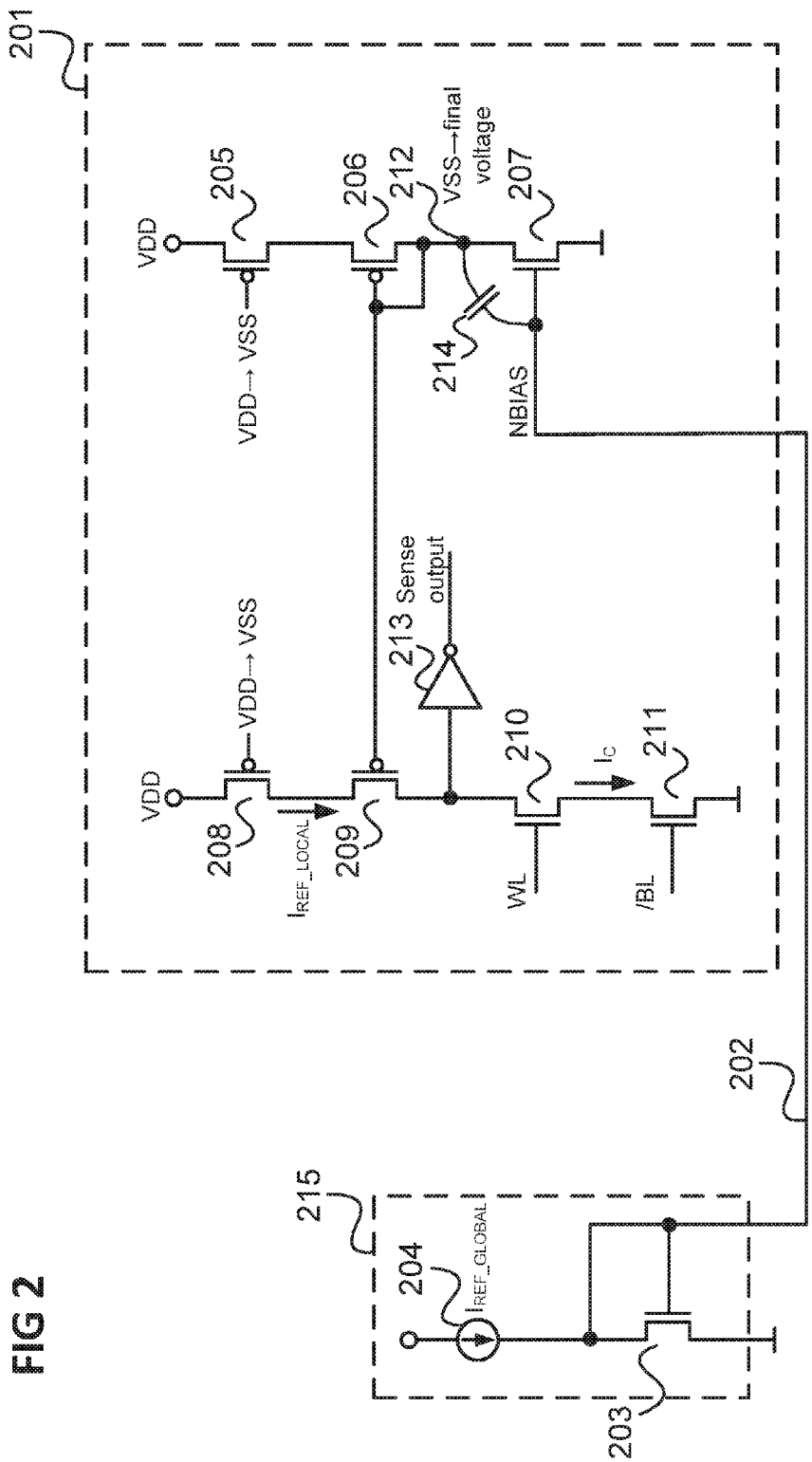
FIG. 2 shows a sense amplifier arrangement.

FIG. 2 shows a sense amplifier arrangement 200.

The sense amplifier arrangement 200 includes a sense amplifier 201.

In this example, the sense amplifier 201 is supplied by a bias voltage NBIAS from a bias line 202 which is connected to the gate and the drain of a first n channel field effect transistor 203 (FET, e.g. MOSFET, i.e. metal-oxide-semiconductor FET). The drain of the first n channel FET 203 is supplied with a global reference current $I_{REF\_GLOBAL}$ from a current source 204. The source of the first n channel FET 203 is connected to ground (i.e. low supply potential VSS).

The arrangement of current source 204 and the first n channel FET 203 may for example form a central biasing block 215 that provides many sense amplifiers of the memory array 101 with the current reference.

The sense amplifier 201 includes a first p channel FET 205 whose source is connected to the high supply potential (VDD) and whose drain is connected to the source of a second p channel FET 206 whose drain is connected to the drain of a second n channel FET 207 whose source is connected to ground.

The sense amplifier 201 further includes a third p channel FET 208 whose source is connected to the high supply potential (VDD) and whose drain is connected to the source of a fourth p channel FET 209 whose drain is connected to the drain of a third n channel FET 210. The source of the third n channel FET 210 is connected to the drain of a fourth n channel FET 211 whose source is connected to ground (i.e. the low supply potential VSS).

The drain of the third n channel FET 210 is further connected to the input of an inverter 213 whose outputs is the output of the sense amplifier. The gate of the third n channel FET 210 is connected to the word line 104 of the memory cell 102 to be read and the second n channel FET 210 is connected to the bit line /BL of the memory cell 102 to be read, as illustrated in FIG. 1.

The gate of the fourth p channel FET 209 is connected to the gate of the second p channel FET 206 which is also connected to the drain of the second p channel FET 206.

When the sense amplifier 201 is off (e.g. in idle mode or power saving state), the gate of the first p channel FET 205 and the gate of the third p channel FET 208 are supplied with VDD, e.g. an enable signal EN_B supplied to these gates is at VDD. The node 212 at which the drain of the second p channel FET 206 and the drain of the second n channel FET 207 are connected is therefore at ground potential (VSS) when the sense amplifier is off.

When the sense amplifier 201 is switched on (e.g. when idle mode is left to read out the memory cell) the gate of the first p channel FET 205 and the gate of the third p channel FET 208 are supplied with VSS, i.e. EN_B is switched to VSS.

This results in a local copy $I_{REF\_LOCAL}$ of the reference current $I_{REF\_GLOBAL}$ flowing through the third p channel FET 208 and the fourth p channel FET 209. Depending on whether the current $I_C$ that is caused to flow through the third n channel FET 210 and the fourth n channel FET 211 is larger or smaller than the local reference current $I_{REF\_LOCAL}$ (and thus depending on which value is stored in the memory cell 102) the inverter outputs a different result.

When the sense amplifier 201 is switched on, the node 212 goes from VSS to a final voltage. Typically, the bias line 202 and the node 212 are capacitively coupled by a parasitic capacitance 214.

Because of this, when the sense amplifier 201 is switched on together with other sense amplifiers (e.g. from a power safe mode to a high performance mode) the bias line 202 (and similarly all these global lines driven by the central biasing block 215) is subjected to a disturbance coming from the sense amplifiers (also referred to as kickback noise) and until the relaxation time of this event has not expired the sense amplifiers may not be capable to function properly.

There is a limit for this relaxation time coming from the resistance and capacitance of the bias line 202 lines together with the amount of current and complexity invested for controlling the bias line 202. This may for example create a bottleneck for implementation of low power and low access time sense amplifiers.

Figure 3:
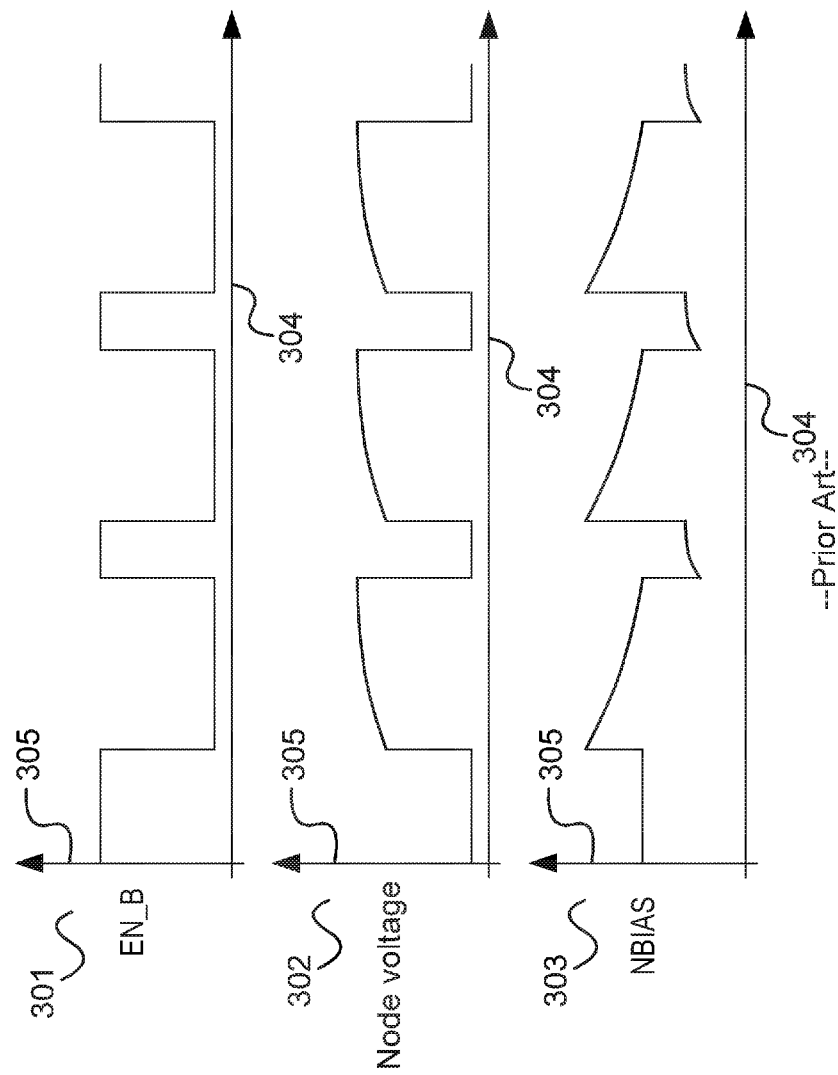
FIG. 3 shows diagrams illustrating the kickback noise on the bias line of the sense amplifier arrangement shown in FIG. 2.

FIG. 3 shows diagrams 301, 302, 303 illustrating the kickback noise on the bias line 202.

In the diagrams 301, 302, 303 time flows from left to right along a respective horizontal axis 304 (corresponding to the same time scale) and the level of the respective signal increase from bottom to top along a respective vertical axis 305.

The first diagram 301 shows the enable signal EN_B supplied to the first p channel FET 205 and the third p channel FET 208.

The second diagram 302 shows the potential at the node 212.

The third diagram 303 shows the potential of the bias line 202.

As can be seen, the kickback noise generates a temporary variation in the NBIAS voltage that lasts until the relaxation time is over. It typically affects the sensing operation and its magnitude depends from many factors like the difference between the initial and final voltage at the node 212, the capacitance 214, the RC of the line characteristics of the central biasing block etc.

A countermeasure to the kickback noise is to add buffer capacitors to the bias line 202 at the cost of area.

Figure 4:
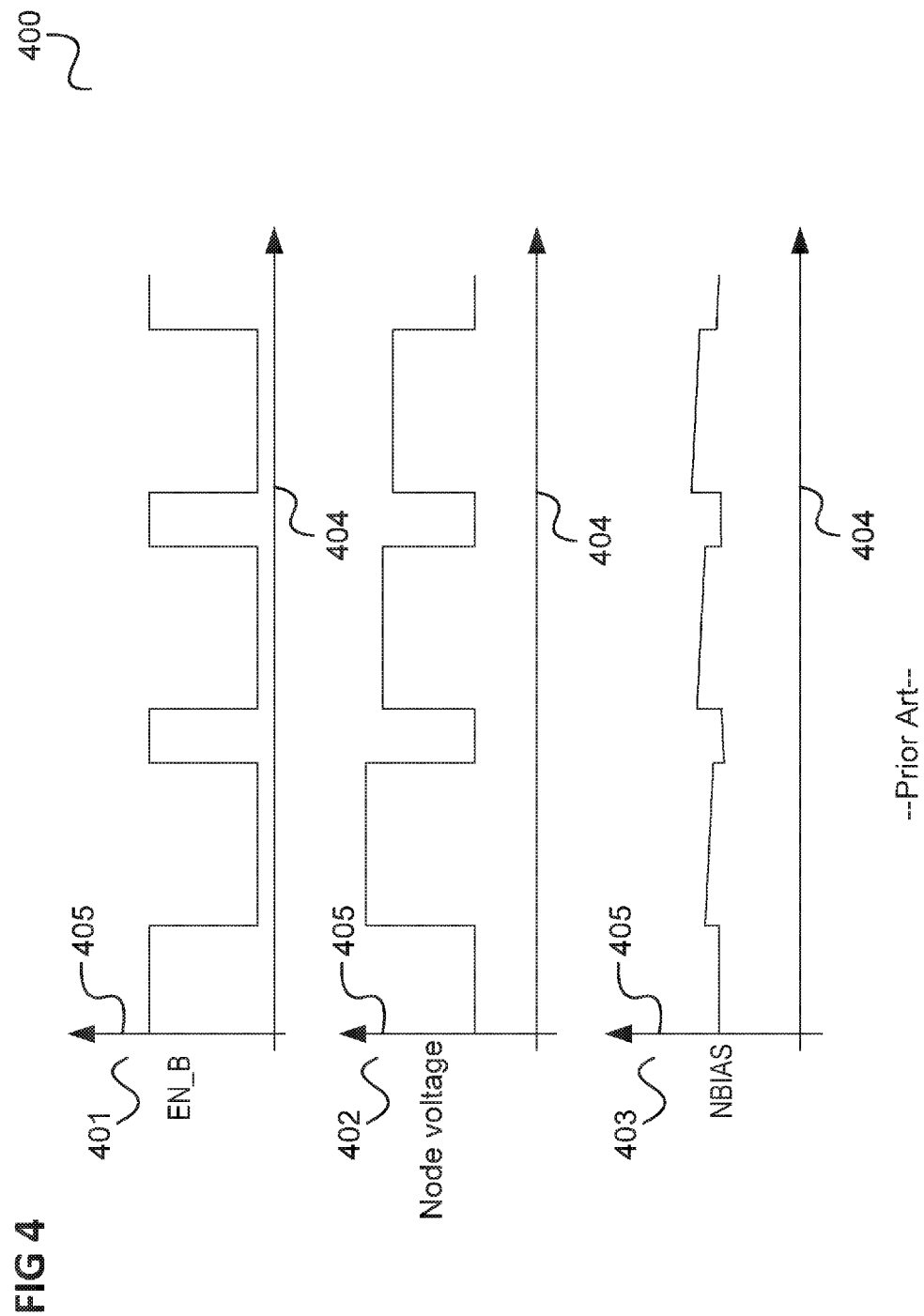
FIG. 4 shows diagrams illustrating the behavior in case of the usage of a buffer capacitor for the bias line of the sense amplifier arrangement shown in FIG. 2.

FIG. 4 shows diagrams 401, 402, 403 illustrating the behavior in case of the usage of a buffer capacitor for the bias line 202.

In the diagrams 401, 402, 403 time flows from left to right along a respective horizontal axis 404 (corresponding to the same time scale) and the level of the respective signal increase from bottom to top along a respective vertical axis 405.

The first diagram 401 shows the enable signal EN_B supplied to the first p channel FET 205 and the third p channel FET 208.

The second diagram 402 shows the potential at the node 212.

The third diagram 403 shows the potential of the bias line 202.

As can be seen, a buffer capacitor increases the relaxation time which causes a cumulative effect that may be even less desirable than the behavior illustrated in FIG. 3.

Further, making the RC of the biasing line and the capacitance 214 smaller and increasing the bandwidth and current capability of the central biasing block there may not be sufficient.

In the following, an embodiment is described that may allow reducing the impact of kickback noise.

Figure 5:
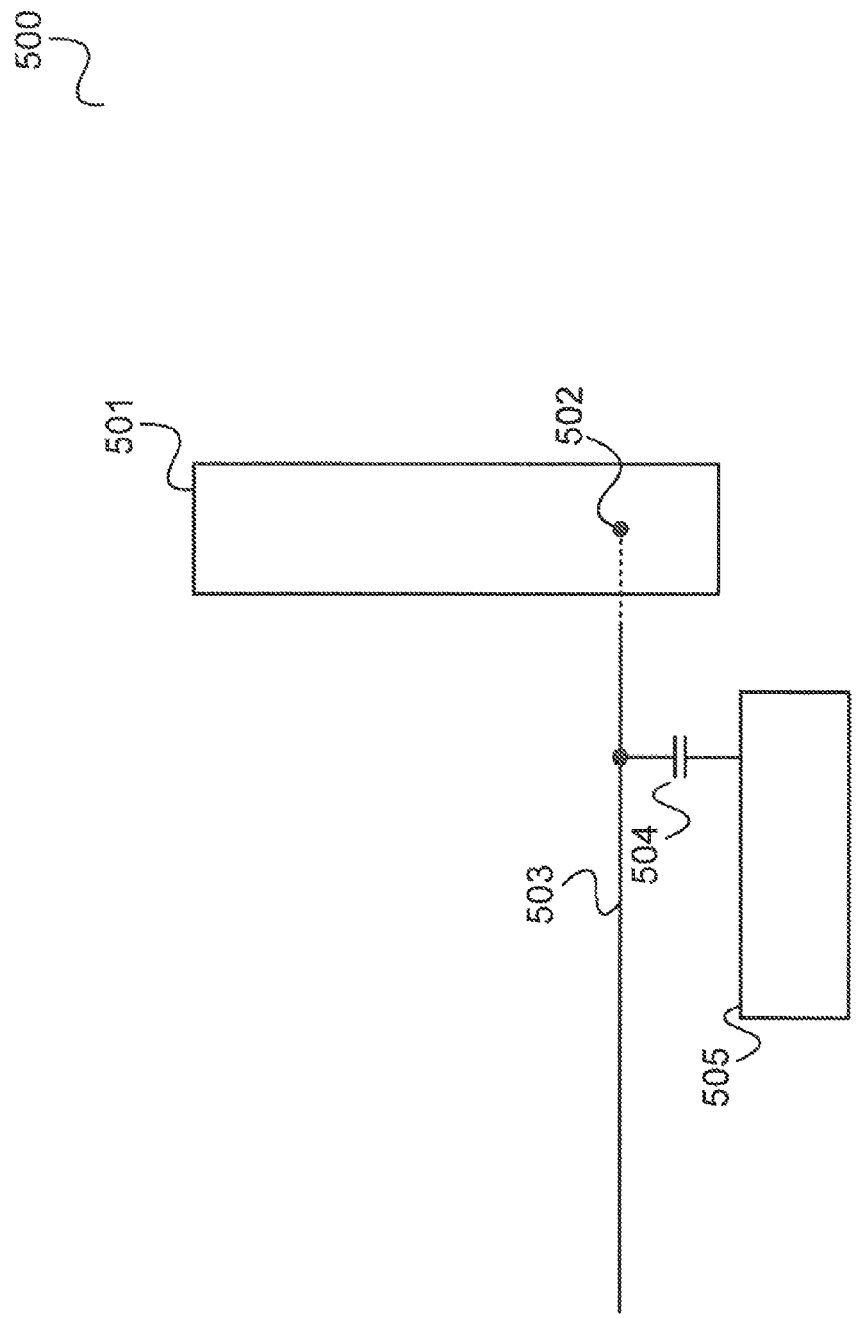
FIG. 5 shows a circuit according to an embodiment.

FIG. 5 shows a circuit 500 according to an embodiment.

The circuit 500 includes a circuit component 501 configured to switch from a first state (e.g. off) into a second state (e.g. on) including a node 502 whose potential changes by a predetermined voltage when the circuit component switches from the first state into the second state.

The circuit 500 further includes a line 503 coupled with the node 502. The switching of the circuit component 501 from the first state into the second state draws or injects a predetermined charge from or into the line 503 and a capacitor 504 coupled to the line 503.

Further, the circuit 500 includes a compensation circuit 505 configured to generate a predetermined multiple of the predetermined voltage and to compensate the charge drawn from or injected into the line 503 by driving the capacitor 504 with the multiple of the predetermined voltage, e.g. injects/draws the same amount of charge into/from the line 503 that was drawn/injected by the switching of the circuit component 501.

In other words, the voltage change at a node which causes a kickback to a line (e.g. at node 212 causing kickback to the biasing line 202) is amplified and the charge drawn from or injected into the line is compensated by a capacitor driven with the amplified voltage. Thus, the kickback can be compensated while using a small capacitor, i.e. with only a small increase of the RC characteristic of the line.

It should be noted that a charge being injected into the line may be understood as the same amount of charge of the opposite polarity being drawn from the line. In other words, the expression that "charge is being drawn" from the line (or from a node) may be understood as charge being drawn as well as charge being injected to the line (or node). Similarly, the expression that "charge is being injected" into the line (or into a node) may be understood as charge being drawn as well as charge being injected to the line (or node).

In the following, examples according to various embodiments are given.

Example 1 is a circuit as described above with reference to FIG. 5.

In Example 2, the subject matter of Example 1 may optionally include the circuit component being a circuit branch of a current mirror circuit.

In Example 3, the subject matter of Example 1 or 2 may optionally include the compensation circuit including a switching circuit configured to switch on the driving of the capacitor with the multiple of the predetermined voltage in response to an enable signal.

In Example 4, the subject matter of any one of Examples 1 to 3 may optionally include the line being a biasing line configured to supply a biasing current or a biasing voltage to the circuit component.

In Example 5, the subject matter of any one of Examples 1 to 4 may optionally include the line being configured to supply a current reference or voltage reference to the circuit component.

In Example 6, the subject matter of any one of Examples 1 to 5 may optionally include the line coupling a global biasing circuit with the circuit component.

In Example 7, the subject matter of any one of Examples 1 to 6 may optionally include the circuit component being a component of a memory sense amplifier.

In Example 8, the subject matter of any one of Examples 1 to 7 may optionally include a plurality of memory sense amplifiers wherein the line couples a global biasing circuit with the memory sense amplifiers.

In Example 9, the subject matter of any one of Examples 1 to 8 may optionally include the node being the center node of a cascode of field effect transistors.

In Example 10, the subject matter of any one of Examples 1 to 9 may optionally include the compensation circuit being configured to generate a potential corresponding to the predetermined voltage.

In Example 11, the subject matter of any one of Examples 1 to 10 may optionally include the line connecting the gate of one of the field effect transistors with the compensation circuit and the compensation circuit including a cascode of field effect transistors configured to generate a potential corresponding to the predetermined voltage.

In Example 12, the subject matter of Example 11 may optionally include the compensation circuit including an amplifier configured to amplify the generated potential.

In Example 13, the subject matter of Example 11 may optionally include the compensation circuit including an inverter configured to receive the amplified potential as supply voltage and configured to drive the capacitor by means of its output.

In Example 14, the subject matter of Example 13 may optionally include the inverter being configured to receive as its input an enable signal for switching on the driving of the capacitor with the multiple of the predetermined voltage.

In Example 15, the subject matter of any one of Examples 1 to 14 may optionally include the capacitor being dimensioned to compensate the charge drawn from or injected into the line when driven with the multiple of the predetermined voltage.

In Example 16, the subject matter of any one of Examples 1 to 15 may optionally include the predetermined multiple of the predetermined voltage being the predetermined voltage multiplied by an amplification factor and the capacitor having a capacity corresponding to a capacity between the line and the node divided by the amplification factor.

In Example 17, the subject matter of any one of Examples 1 to 16 may optionally include the first state being a power saving state and the second mode being an operational state.

In Example 18, the subject matter of any one of Examples 1 to 17 may optionally include the circuit component being configured to switch from the first state to the second state in response to an activation signal.

In Example 19, the subject matter of claim 18 may optionally include the compensation circuit being configured to receive an enable signal for switching on the driving of the capacitor with the multiple of the predetermined voltage in response to the switching of the circuit component from the first state to the second state.

In Example 20, the subject matter of Example 19 may optionally include the enable signal being based on the activation signal.

In Example 21, the subject matter of any one of Examples 1 to 20 may optionally include the line being capacitively coupled with the node.

In the following, embodiments are described in more detail. The following embodiments are examples for a kickback noise compensation in a memory sense amplifier arrangement as illustrated in FIG. 2.

Figure 6:
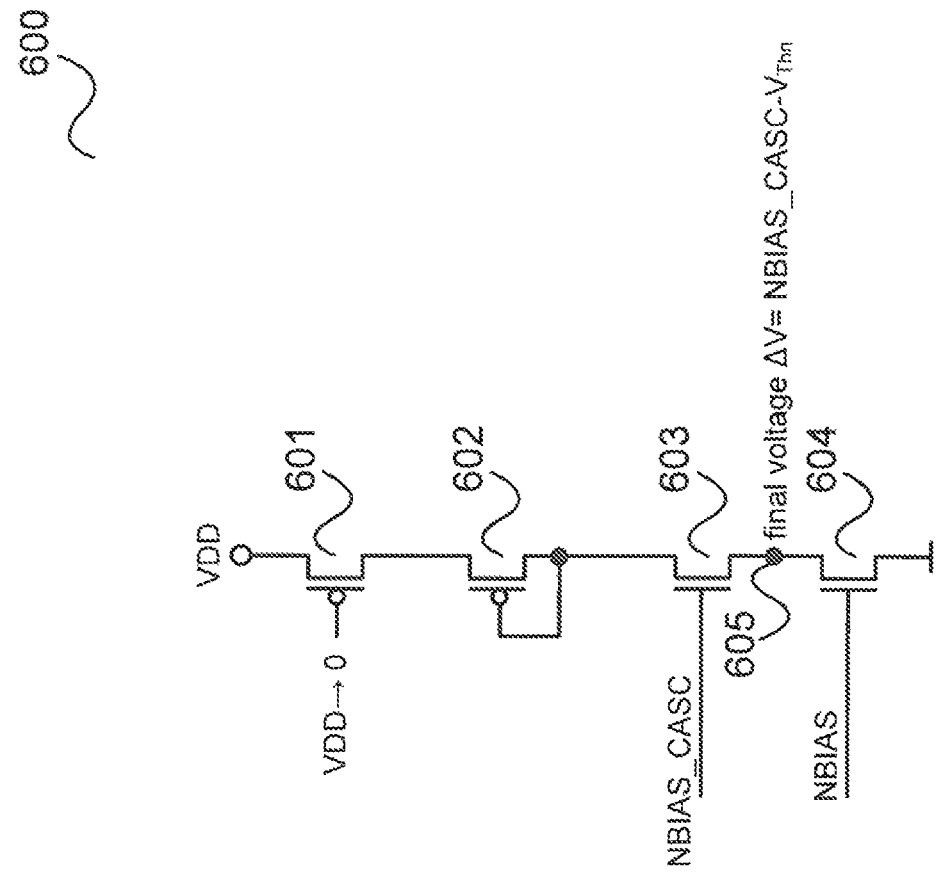
FIG. 6 shows circuit branch of a sense amplifier according to an embodiment.

According to one embodiment, a first measure to compensate kickback noise is to reduce the noise smaller and make it more predictable by adding a cascode structure as illustrated in FIG. 6.

FIG. 6 shows circuit branch 600 of a sense amplifier according to an embodiment.

The circuit branch 600 for example corresponds to the circuit branch of the sense amplifier 201 including the first p channel FET 205, the second p channel FET 206 and the second n channel FET 207.

Accordingly, the circuit branch includes a first p channel FET 601 whose source is connected to the high supply potential (VDD) and whose drain is connected to the source of a second p channel FET 602 whose drain is connected to its gate.

In contrast to the sense amplifier 201, the drain of the second p channel FET 602 is connected to a first (cascode) n channel FET 603 whose source is connected (at a node 605 corresponding to the node 212) to the drain of a second n channel FET 604 whose source is connected to ground.

The first p channel FET 601 is supplied with the enable signal EN_B at its gate. The first n channel FET 603 is supplied with a cascode bias signal NBIAS_CASC at its gate and the second n channel FET 604 is supplied with the bias signal NBIAS at its gate.

The bias signal NBIAS may for example be generated by an additional circuit in order to leave at the drain of the transistor 604 sufficient voltage to be in saturation.

The magnitude of the kickback noise can be sensed by sensing the delta voltage (voltage difference) at the node 605 which is referred to by $\Delta V = NBIAS\_CASC - V_{Thn}$, wherein $V_{Thn}$ is the threshold voltage of the first n channel FET 603.

Figure 7:
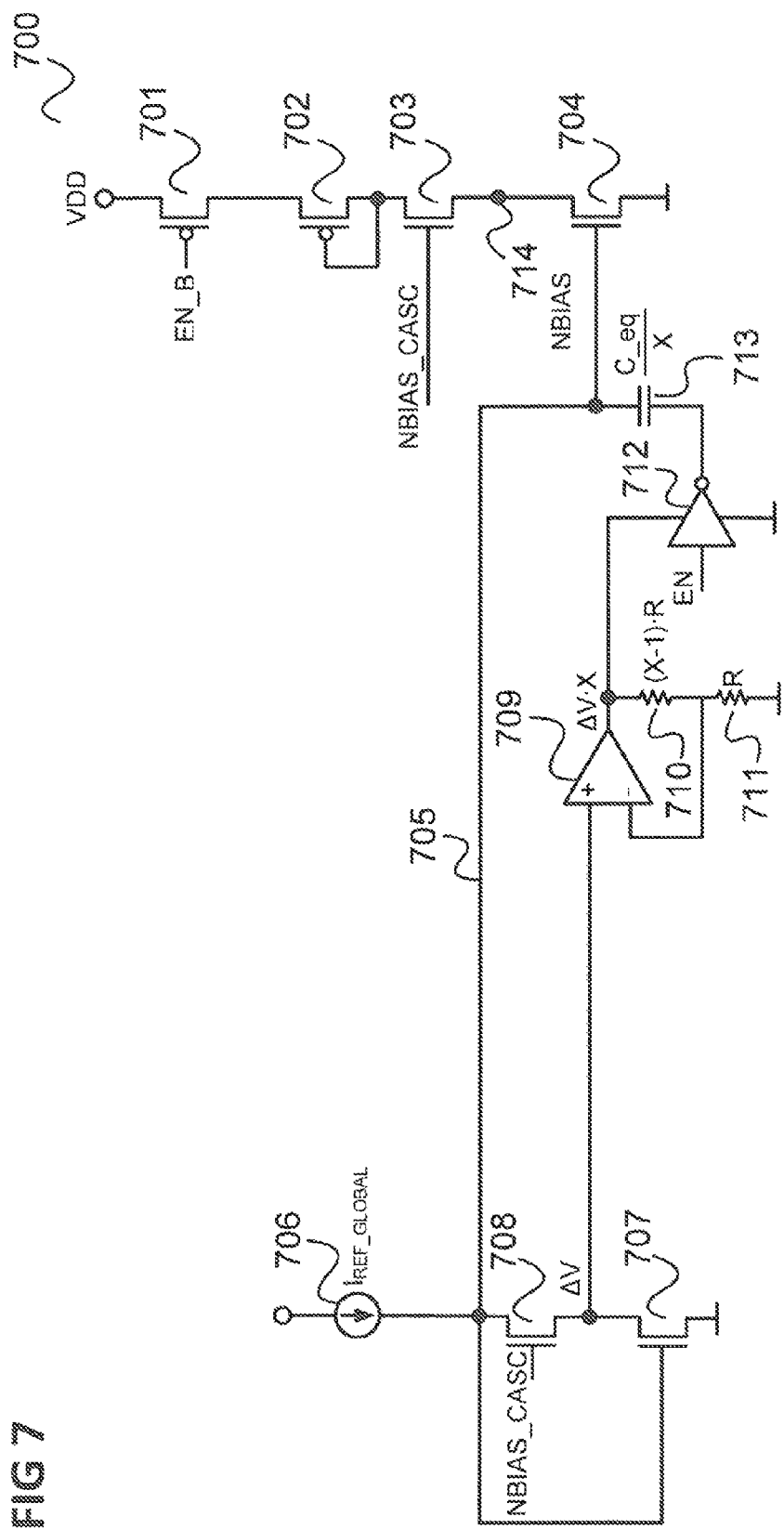
FIG. 7 shows a sense amplifier arrangement according to an embodiment.

This voltage may then be amplified and used to drive a capacitor to compensate the kickback noise as illustrated in FIG. 7.

FIG. 7 shows a sense amplifier arrangement 700 according to an embodiment.

Of the sense amplifier, only a circuit branch corresponding to the circuit branch 600 is shown, including a first p channel FET 701, a second p channel FET 702, a first n channel FET 703 and a second n channel FET 704 as described with reference to FIG. 6.

The second n channel FET 704 receives the bias voltage from a bias line 705 connected to a current source 706 providing a global reference current. As described with reference to FIG. 2, the bias line 705 is coupled to the gate of a third n channel FET 707 whose source is connected to ground. In contrast to the sense amplifier arrangement 200 of FIG. 2, the drain of the third n channel FET 707 is not directly connected to the bias line 705, but is connected to the source of fourth (cascode) n channel FET 708 whose drain is connected to the bias line 705 and whose gate is supplied with the cascode bias voltage NBIAS_CASC. Thus, the voltage at the source of the fourth n channel FET 708 corresponds to the delta voltage $\Delta V$.

The voltage NBIAS_CASC may for example be the voltage at a terminal of a resistor connected to current source 706. The resistor is connected between the current source 706 and the bias line 705 (instead of the direct coupling of current source 706 and bias line 705 as illustrated in FIG. 7).

This voltage is supplied to the positive input of a differential amplifier 709 whose output is fed back to its negative input via a voltage divider including a first resistor 710 coupled between its output and its negative input and a second resistor 711 coupled between its negative input and ground. The first resistor 710 has a value of $(X-1) \cdot R$ and the second resistor 711 has a value of R such that the output voltage of the differential amplifier 709 is $\Delta V \cdot X$. The output voltage is fed as supply voltage to an inverter 712 (whose other supply terminal is connected to ground). The inverter 712 receives an enable signal EN as input and its output is connected to a capacitor 713 coupled between the output of the inverter 712 and the bias line 705.

The capacitor 713 has a capacity of $$\frac{C\_eq}{X}$$

wherein C_eq is a capacity equivalent to the capacitive coupling between the bias line 705 and the node 714 (corresponding to node 212).

Thus the same charge Q is fed back to the bias line as it is drawn from the bias line when the sense amplifier is switched on (or drawn from the bias line as it is injected into the bias line when the sense amplifier is switched on) using a capacitance that is X time smaller than the equivalent capacity but charged up to X times of $\Delta V$ according to $$Q = C\_eq \cdot \Delta V = (C\_eq/X) \cdot (X \cdot \Delta V)$$

The feedback operation is performed by the inverter 712 which boosts the capacitor 713.

Thus, the charge drawn from the global line can be compensated by a relatively small increase of the RC characteristic (and thus the relaxation time) of the bias line 705, depending on the amplification factor.

The amplification factor may be chosen as high as possible. For example, Nbias_casc−Vthn is typically around 100 mV and a typical internal logic supply voltage is 1.2V. The amplification is in this case for example chosen as 10 such that X=10, $\Delta V$=100 mV, C~500 fF.

Additionally, the intrinsic nonlinearity of the capacitive coupling of bias line 705 and node 714 may be mimicked with a careful selection of X and thus C_eq/X.

The enable signal EN fed to the inverter 712 may be based on the enable sign EN_B fed to the gate of the first p channel MOSFET 701. However, the charge compensation (or charge balance) does not have to be perfectly synchronous with the switching on of the sense amplifier. If there lies a time offset or a lack of overlap between the kickback noise generation event (switching on of the sense amplifier) and the kickback noise compensation event (enabling the inverter 712) which is reasonably small in comparison to the sensing time the memory arrangement will see this as a perfect compensation as in a typical switch capacitor circuit.

The sense amplifier arrangement 700 may be part of a memory circuit including a plurality of sense amplifiers. The inverter 712 and the capacitor 713 are then for example provided for each sense amplifier. Alternatively, a single inverter 712 and/or a single capacitor 713 (with a correspondingly increased capacity) may be provided for a plurality of sense amplifiers. The amplifier 709 is for example provided for a plurality of sense amplifiers (e.g. in the central biasing circuit including the current source 706).

It should be noted that the cascode implemented by the first n channel FET 703 is optional and the compensation may be implemented similarly without cascode.

Further, it should be noted that the compensation may also be implemented without amplification of $\Delta V$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit, comprising:
a circuit component configured to switch from a first state into a second state comprising a node whose potential changes by a predetermined voltage when the circuit component switches from the first state into the second state;
a line coupled with the node wherein the switching of the circuit component from the first state into the second state draws or injects a predetermined charge from or into the line;
a capacitor coupled to the line; and
a compensation circuit that is Alternating Current-coupled (AC-coupled) to the line via the capacitor, and configured to generate a predetermined multiple of the predetermined voltage and to compensate the charge drawn from or injected into the line by driving the capacitor with the multiple of the predetermined voltage.

2. The circuit of claim 1,
wherein the circuit component is a circuit branch of a current mirror circuit.

3. The circuit of claim 1,
wherein the compensation circuit comprises a switching circuit configured to switch on the driving of the capacitor with the multiple of the predetermined voltage in response to an enable signal.

4. The circuit of claim 1,
wherein the line is a biasing line configured to supply a biasing current or a biasing voltage to the circuit component.

5. The circuit of claim 1,
wherein the line is configured to supply a current reference or voltage reference to the circuit component.

6. The circuit of claim 1,
wherein the line couples a global biasing circuit with the circuit component.

7. The circuit of claim 1,
wherein the circuit component is a component of a memory sense amplifier.

8. The circuit of claim 1, further comprising:
a plurality of memory sense amplifiers;
wherein the line couples a global biasing circuit with the memory sense amplifiers.

9. The circuit of claim 1,
wherein the node is the center node of a cascode of field effect transistors.

10. The circuit of claim 1,
wherein the compensation circuit is configured to generate a potential corresponding to the predetermined voltage.

11. The circuit of claim 1,
wherein the line connects the gate of one of the field effect transistors with the compensation circuit and the compensation circuit comprises a cascode of field effect transistors configured to generate a potential corresponding to the predetermined voltage.

12. The circuit of claim 11,
wherein the compensation circuit comprises an amplifier configured to amplify the generated potential.

13. The circuit of claim 12,
wherein the compensation circuit comprises an inverter configured to receive the amplified potential as supply voltage and configured to drive the capacitor by means of its output.

14. The circuit of claim 13,
wherein the inverter is configured to receive as its input an enable signal for switching on the driving of the capacitor with the multiple of the predetermined voltage.

15. The circuit of claim 1,
wherein the capacitor is dimensioned to compensate the charge drawn from or injected into the line when driven with the multiple of the predetermined voltage.

16. The circuit of claim 1,
wherein the predetermined multiple of the predetermined voltage is the predetermined voltage multiplied by an amplification factor and the capacitor has a capacity corresponding to a capacity between the line and the node divided by the amplification factor.

17. The circuit of claim 1,
wherein the first state is a power saving state and the second mode is an operational state.

18. The circuit of claim 1,
wherein the circuit component is configured to switch from the first state to the second state in response to an activation signal.

19. The circuit of claim 18,
wherein the compensation circuit is configured to receive an enable signal for switching on the driving of the capacitor with the multiple of the predetermined voltage in response to the switching of the circuit component from the first state to the second state.

20. A circuit, comprising:
a circuit component configured to switch from a first state into a second state comprising a node whose potential changes by a predetermined voltage when the circuit component switches from the first state into the second state;
a line coupled with the node wherein the switching of the circuit component from the first state into the second state draws or injects a predetermined charge from or into the line;
a capacitor coupled to the line; and
a compensation circuit configured to receive, as an input, a voltage equal to the predetermined voltage, to amplify the voltage with an amplification factor of the compensation circuit to generate a predetermined multiple of the predetermined voltage, and to compensate the predetermined charge drawn from or injected into the line by driving the capacitor from a terminal of the capacitor opposite the line with the predetermined multiple of the predetermined voltage.

21. The circuit of claim 20, wherein the compensation circuit is configured to sense the voltage equal to the predetermined voltage by sensing a second node whose charge is predetermined to replicate the predetermined charge.

* * * * *